(12) United States Patent
Taylor et al.

(10) Patent No.: US 8,060,846 B2
(45) Date of Patent: Nov. 15, 2011

(54) INDUCTANCE MITIGATION THROUGH SWITCHING DENSITY ANALYSIS

(75) Inventors: Stuart A. Taylor, Sunnyvale, CA (US); Edward M. Roseboom, Sunnyvale, CA (US); Simon Burke, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1108 days.

(21) Appl. No.: 11/732,950

(22) Filed: Apr. 4, 2007

(65) Prior Publication Data
US 2008/0250368 A1    Oct. 9, 2008

(51) Int. Cl.
*G06F 17/50*    (2006.01)

(52) U.S. Cl. ........ 716/106; 716/107; 716/108; 716/110; 716/111; 716/115

(58) Field of Classification Search .............. 716/1, 4–6, 716/9–13, 106–108, 111–115, 119, 134–136
See application file for complete search history.

(56) References Cited

U.S. PATENT DOCUMENTS

2002/0104064 A1 *  8/2002  Sasaki et al. ...................... 716/6
2005/0120316 A1 *  6/2005  Suaya et al. ...................... 716/4

* cited by examiner

*Primary Examiner* — Paul Dinh
(74) *Attorney, Agent, or Firm* — Volpe and Koenig, P.C.

(57) ABSTRACT

Embodiments of a method for detecting potential areas of inductive coupling in a high density integrated circuit design are described. The inductance mitigation process first converts the inductive analysis into a density problem. The density of wires within a region that may switch within a portion of the system clock are compared to the density of wires will not switch within that same time. Regions of the chip that have a high ratio of density of switching wires versus non-switching wires are determined to have the potential of an inductive coupling problem. Additional grounded metal is added into the problematic regions of the chip to improve the switching versus non-switching wire density.

12 Claims, 6 Drawing Sheets

| NAME | TYPE | SHAPE | METAL LAYER | TIMING WINDOW | DATABASE REPRESENTATION |
|---|---|---|---|---|---|
| W1 | WIRE | ———— | M7 | B1, B2, B3 | M7B1 M7B2 M7B3 |
| W2 | WIRE | ———— | M5 | B3, B4, B5 | M5B3 M5B4 M5B5 |
| W4 | WIRE | ———— | M6 | B3, B4 | M6B3 M6B4 |

INDUCTANCE MITIGATION THROUGH SWITCHING DENSITY ANALYSIS

FIELD

Embodiments of the invention relate generally to semiconductor manufacturing, and more specifically to detecting and correcting potential areas of inductive coupling in a circuit design.

BACKGROUND

When two or more signal wires run in parallel they have the potential to interfere with each other through either capacitive or inductive coupling effects. In general, capacitance is a short distance effect that impacts only immediately neighboring wires, and several different tools automated circuit design tools have been developed to detect and measure the impact of capacitive coupling in a circuit. Unlike capacitance, induction is a relatively long distance effect, and is therefore harder to detect and analyze. Inductive coupling occurs when a change in current flow through one component or wire induces a current flow in another component or wire through a shared magnetic field. Its impact is not necessarily limited to immediately neighboring wires, and in fact can reach far across a particular chip or system.

In the design and layout of VLSI (Very Large Scale Integration) devices, which have many wires, inductive coupling is especially difficult to analyze and correct. As circuit designs become denser, the number of parallel wires (traces) increases, while the spacing between the wires decreases. Inductive coupling can become a particular problem when these dense, wide busses switch at or near the same time. Powerful enough inductive coupling can cause glitches in digital circuits when inadvertent state changes in a wire are caused by the induction induced by one or more other wires changing state.

Current methods of detecting and correcting inductive coupling effects typically rely on traditional method of inductor extraction and analysis through circuit simulation tools, such as SPICE (Simulation Program with Integrated Circuit Emphasis). This limits the technology to analysis of a small subset of the total number of signals on the VLSI device. An alternate approach using reluctors has also been developed, however, such approaches are also limited in capacity and typically lack full chip coverage. Such methods also require knowledge of an effected area, and are thus ineffective at detecting unknown problem areas in a design. In general, present methods of detecting and analyzing inductive coupling effects are limited to circuit densities on the order of thousands of wires. Such methods are totally inadequate for circuit densities on the order of millions or tens of millions of wires.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of a method for detecting potential areas of inductive coupling in a high density integrated circuit design are described. The inductance mitigation process first converts the inductive analysis into a density problem. The density of wires within a region that may switch within a portion of the system clock are compared to the density of wires that will not switch within that same time. Regions of the chip that have a high ratio of density of switching wires versus non-switching wires are determined to have the potential of an inductive coupling problem. Additional grounded metal is added into the problematic regions of the chip to improve the switching versus non-switching wire density.

In the following description, numerous specific details are introduced to provide a thorough understanding of, and enabling description for, embodiments of the inductance mitigation process. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

In general terms, the inductance mitigation process creates an artificial design for a particular design technology to derive a switch density threshold for the technology. Wires within specific portions of the actual circuit are placed into timing windows. Within each timing window, the number of switching nets (or relevant collection of wires) is compared to the number of non-switching nets to give a switching density for the region. If the switching density for a region exceeds the switch density threshold, additional grounded metal layers are inserted into the region to shield the wires from the inductive coupling effects. In general, the presence of non-switching (e.g., grounded) wires in a region that has many switching wires will tend to reduce the effects of induced inductance caused by the switching wires.

Figure 1:
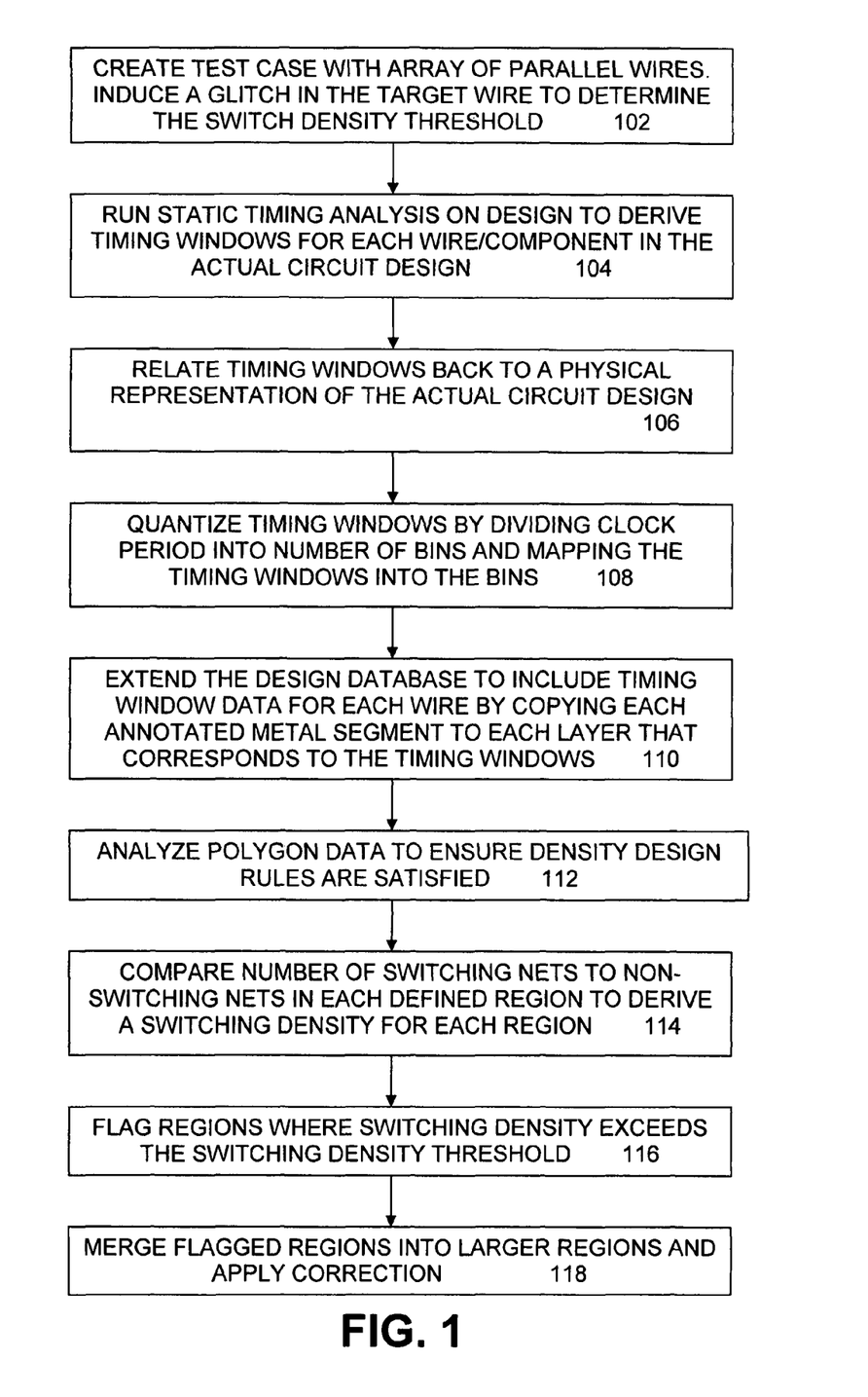
FIG. 1 is a flowchart that illustrates a method of mitigating inductance in a semiconductor design, under an embodiment.

FIG. 1 is a flowchart that illustrates a method of mitigating inductance in a semiconductor design, under an embodiment. As shown in block 102 the process begins by creating an artificial (small) test case consisting of a number of parallel wires based on a particular design technology. For example, the test case could comprise 400 wires (conductors or traces) running in parallel for a length of one millimeter at a minimum spacing corresponding to the technology density. The technology could specify the manufacturing scale, conductor material, design technique, buffer design, and any other relevant technology parameter. For example, the technology could be 65 nm copper wire, 45 nm copper wire, and so on.

One wire of the test case is defined to be a target wire. Using standard measurement techniques, the impact of all wires switching except for the target wire is determined. The minimum number of wires that need to switch before a significant glitch due to induced inductance is seen on the target wire is then determined. The result of this test case provides a switching density threshold. For the technology design, the switching density threshold represents a minimum number of switching wires (relative to non-switching wires) that may cause problems in the design.

Figure 2:
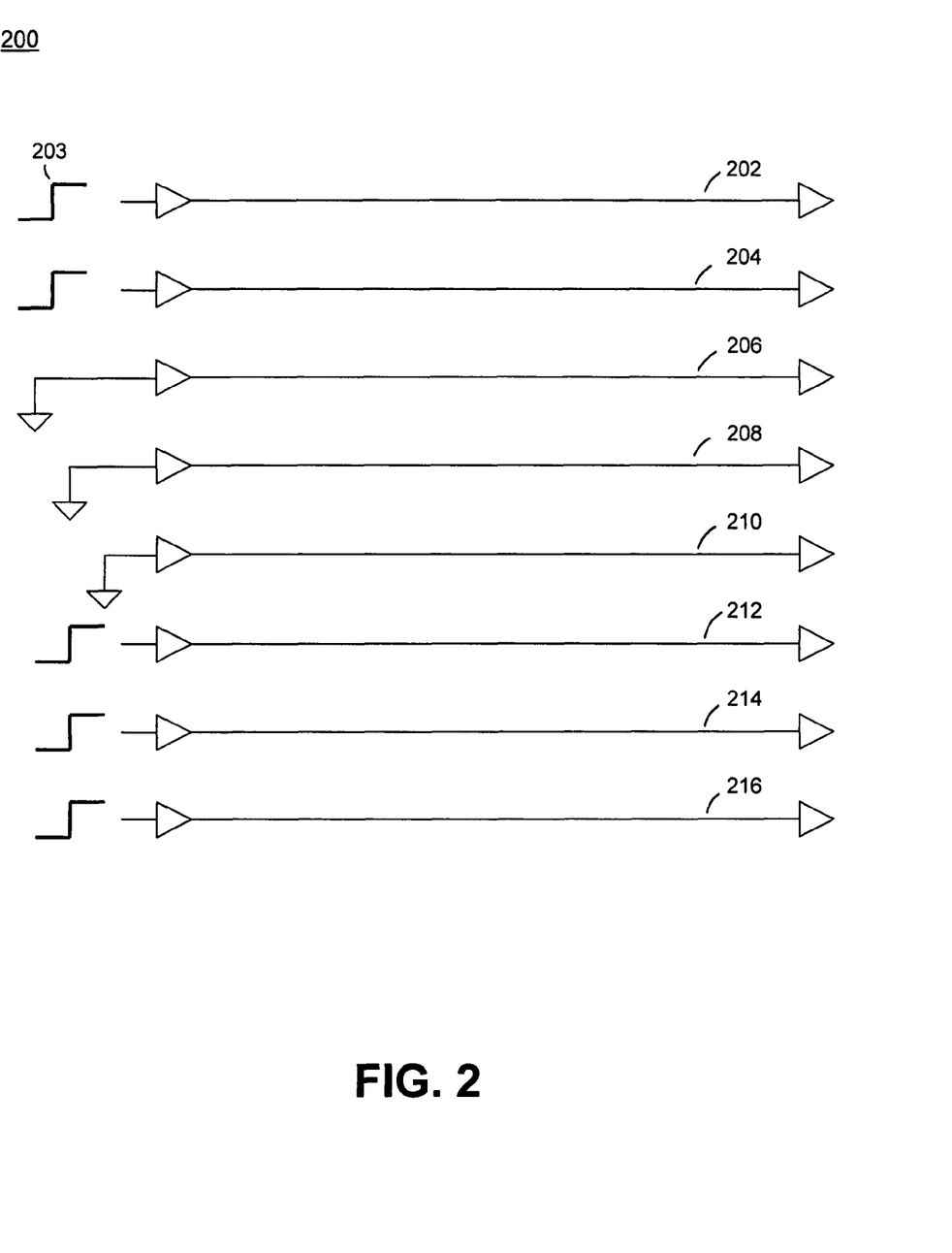
FIG. 2 illustrates an array of wires including a target wire for a test case, under an embodiment.

FIG. 2 illustrates an array of wires including a target wire for a test case, under an embodiment. The wire array 200 comprises a number of wires (e.g., 400) of a certain length (e.g., 1 mm) running parallel to one another in a certain direction. This array essentially represents a portion of a bus. The distance between the wires (pitch) depends on the characteristics or constraints of the design technology being analyzed. A particular wire is designated to be a target wire. The other wires, referred to as "interfering wires" are clocked in different numbers to determine the minimum number of interfering wires that are required to induce a glitch in the target wire. In FIG. 2, wire 208 is the designated target wire, and is shielded from capacitive coupling by the immediate neighboring wires 206 and 210, which are all connected to ground. The remaining wires are the interfering wires, which are each connected to one or more clock generators that provide clock signals 203 to these wires. A successively increasing number of interfering wires are switched at the same or nearly the same time to determine whether a glitch is induced in the target wire 208. For example, if wires 204 and 212 are switched via clock signal 203, and no glitch is detected on target wire 208, then wires 202 and 214 may be added in a next switching step. The number of interfering wires is increased until a glitch is induced in the target wire. This minimum number of wires represents the switching density threshold for the particular design technology being analyzed.

Figure 3:
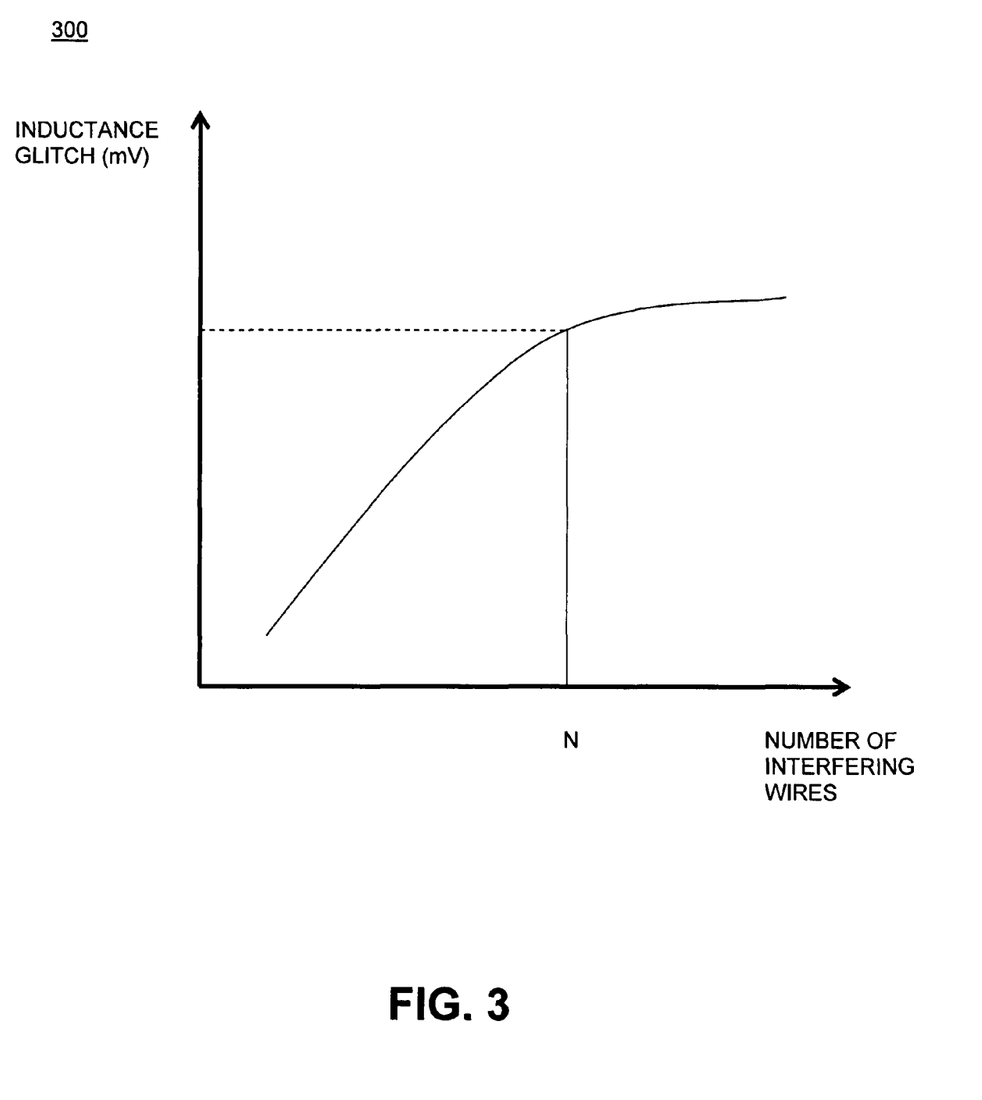
FIG. 3 is a graph that illustrates the determination of the switching density threshold, under an embodiment.

FIG. 3 is a graph that illustrates the determination of the switching density threshold, under an embodiment. The vertical axis of graph 300 represents the voltage on the target wire, and the horizontal axis represents the number of interfering wires that are switched at one time. As the number of interfering wires is increased, the voltage across the target wire increases until a sufficiently high current is induced by the combined switching effect and a glitch is caused. The number, N, of interfering wires that causes the glitch is referred to as the threshold number, and is a measure of the maximum switching density for the test array. The switching density threshold number characterizes a particular technology process node, and is used as a basis of comparison for the actual circuit being designed.

After the switching density threshold for the design technology is determined, a static timing analysis (STA) process, or similar simulation or analysis tool, is run on the actual circuit design to derive timing windows for the design. This is shown as block 104 in FIG. 1. A static timing analyzer is a design tool that calculates the earliest and latest possible times that a signal may arrive at a particular point. Any appropriate STA tool can be used to derive the timing windows, including proprietary tools or commercially available tools, such as the Synopsys® Primetime STA tool. The static timing analyzer will generate a timing window file that specifies the timing windows for each wire or component (e.g., driver or buffer) in the design. A timing window is the range (from some clock datum or trigger) in which a signal may switch. In general, electrical circuit signals have a very small timing window from trigger to actual switch. For example, a typical timing window would be on the order of 2.3 to 2.5 nanoseconds, i.e., after a clock tick, the signal will switch within 2.3 and 2.5 ns. Wires or elements that switch outside of the defined timing window are discarded since these elements will generally not add to the inductive coupling effect, since this effect is maximized when the components all switch virtually at the same time.

As illustrated in block 106 of FIG. 1, once the timing windows are derived, they are related or annotated back to a physical representation of the actual circuit design. For example each metal segment of a signal wire will be related to a specific timing window. This relationship is maintained in the circuit design database.

Figure 4:
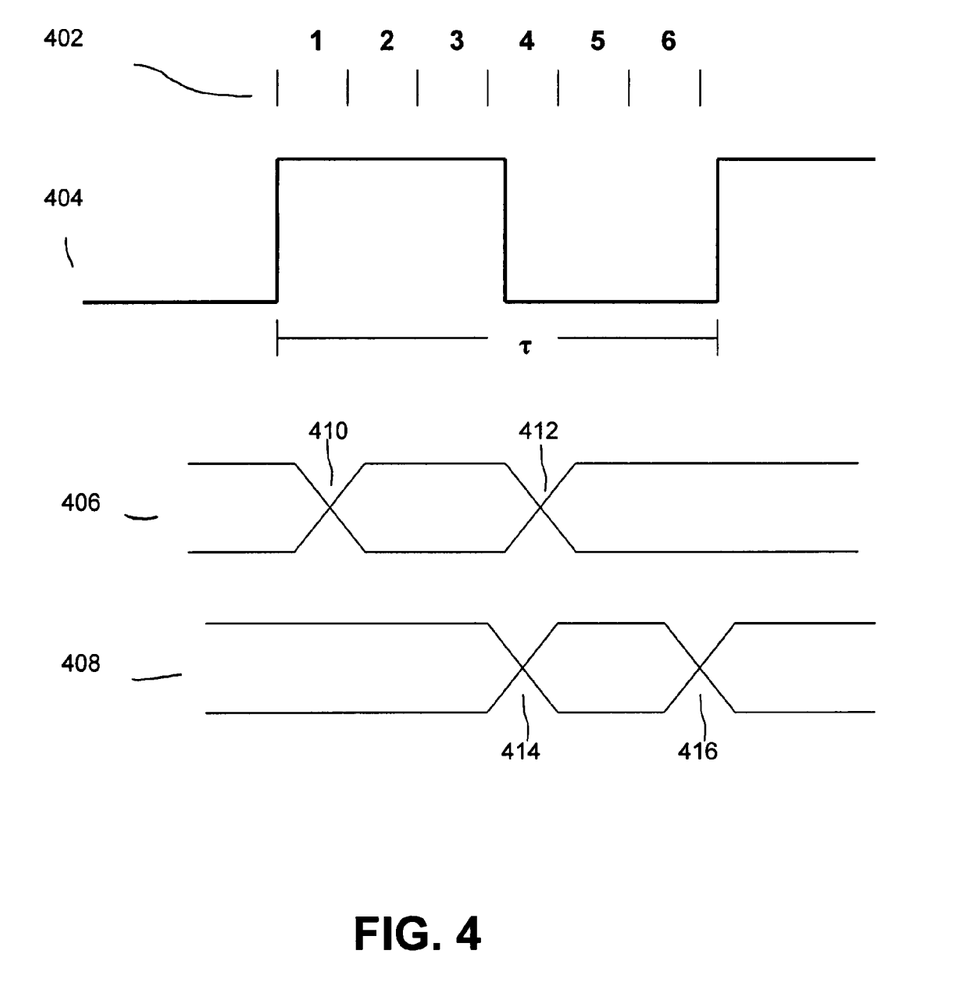
FIG. 4 illustrates the quantization of timing windows and the assignment of example metal lines to bins, according to an embodiment.

In block 108, the timing windows are quantized based on a defined bin size (quanta). For this process, a certain clock period for the circuit is assumed. The clock period is then divided into a number of bins, and the timing windows are then mapped to one or more of the bins. A metal segment of a switching signal wire may thus belong to one or more bins. FIG. 4 illustrates the quantization of timing windows and the assignment of example metal lines to bins, according to an embodiment. For the example of FIG. 4, a clock signal 404 has a certain period, $\tau$. The clock period is divided into a number of bins 402. The number of bins can be determined by the degree of resolution desired, the constraints of the system, or any other possible factors, but typically ranges from four to ten bins per period. For the embodiment of FIG. 4, clock signal 404 is divided into six bins 402. Each timing window of the design is then mapped to particular bins depending upon where the timing window falls relative to the clock period. This is illustrated with respect to two example timing windows 406 and 408. As shown in FIG. 4, timing window 406 starts at time 410, which may be, for example at 0.090 ns, and ends at time 412, which may be at 0.127 ns. Likewise, timing window 408 starts at time 414 and ends at time 416. The bins that are mapped to the timing windows correspond to the bins that are covered or included within the time encompassed by the timing window. Thus, timing window 408 is mapped to bins 1, 2, 3, and 4; while timing window 408 is mapped to bins 4, 5, and 6. This mapping is performed for every wire or component in the circuit design. In this manner, every timing window, and hence every wire, will be associated with one or more quanta of the clock period. This provides a time domain component which can then be used in conjunction with the physical data associated with each wire and component in the design database.

In one embodiment, the circuit design is produced using an IC layout data exchange program that uses a standard database format. One such format is the Graphic Data System (GDS) system. In general, the GDS format is a binary format for representation of geometric shapes, text labels, and other information in hierarchical form. The objects are grouped by numeric attributes and assigned a "layer number" and optional data or text types. Although embodiments are described in relation to the GDS database format, other similar database formats include GDS-II and OASIS, and many other database formats may also be used depending upon the standards adopted by EDA software vendors and designers.

As shown in block 110, the database of the physical representation of the design is extended to incorporate the timing component into the physical design database. In a standard design database, each wire and component has a shape and a layer number. For example, there may be seven layers of metal in a VLSI chip, but the database can support an arbitrary number of layers. The database typically uses a combination of layer number and purpose number, and in one embodiment, a unique layer/purpose pair for each timing window is created. The annotated metal segments are then copied to each layer that corresponds to its timing windows. Thus, within the database definitions, the metal layer number for a wire may be assigned to the purpose definition and the timing window may be assigned to the layer number definition. In this manner, the database is effectively extended to include a new layer related to the timing windows.

Figure 5:
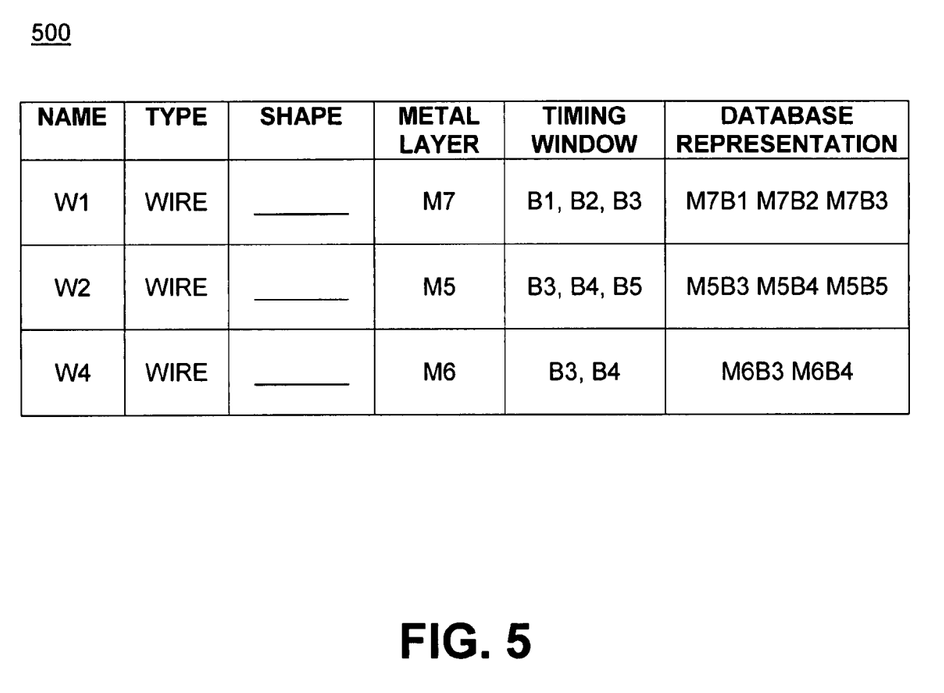
FIG. 5 illustrates an example of database definitions incorporating timing window data for example wires in a circuit design, under an embodiment.

FIG. 5 illustrates an example of database definitions incorporating timing window data for example wires in a circuit design, under an embodiment. As shown in table 500, a particular wire (w1) is assigned to metal layer 7 and has a timing window that is mapped to bins 1, 2, and 3. The database representation for this wire would be M7B1/M7B2/M7B3. Likewise, the database representation for the example wires W2 and W3 would be M5B3/M5B4/M5B5 and M6B3/M6B4, respectively.

The combination metal layer/bin number data that is incorporated within the layer/purpose pair for each timing window is used to define the polygon data for the wires and components. In block 112 of FIG. 1 the polygon data is analyzed to ensure that density design rules are met. In general, standard tools can be used to analyze the polygon data in complex ways to ensure that the metal density and any other relevant design rules are met. In general, a failure to meet a design rule will reduce the yield of the device during manufacture. The density rule measures the total metal of a certain layer within some region of the chip.

The database definitions, such as shown in FIG. 5 include timing window definitions that include all metal segments that are associated with each window. These definitions include all metal segments that switch within the window, as well as metal segments that do not switch in the window.

In one embodiment, the overall chip or system design is partitioned into a number of regions, with each region typically being a small rectangle of a defined size. Within each region, the total number of switching nets is compared to the number of non-switching nets to derive the switching density for that region. This is illustrated as block 114 of FIG. 1. In one embodiment, nets are detected and allocated in either a vertical or horizontal direction. The switching density of each region is then compared with the switching density threshold that was determined in block 102. When the net switching density exceeds this threshold, the region is flagged and stored, block 116. In block 118, the flagged regions are merged into larger regions if possible. In general, regions can be merged if they are in close enough proximity so that the net switching density for the merged region still exceeds the switching density threshold. Any merged or non-merged flagged regions are then processed by a corrective step.

Figure 6:
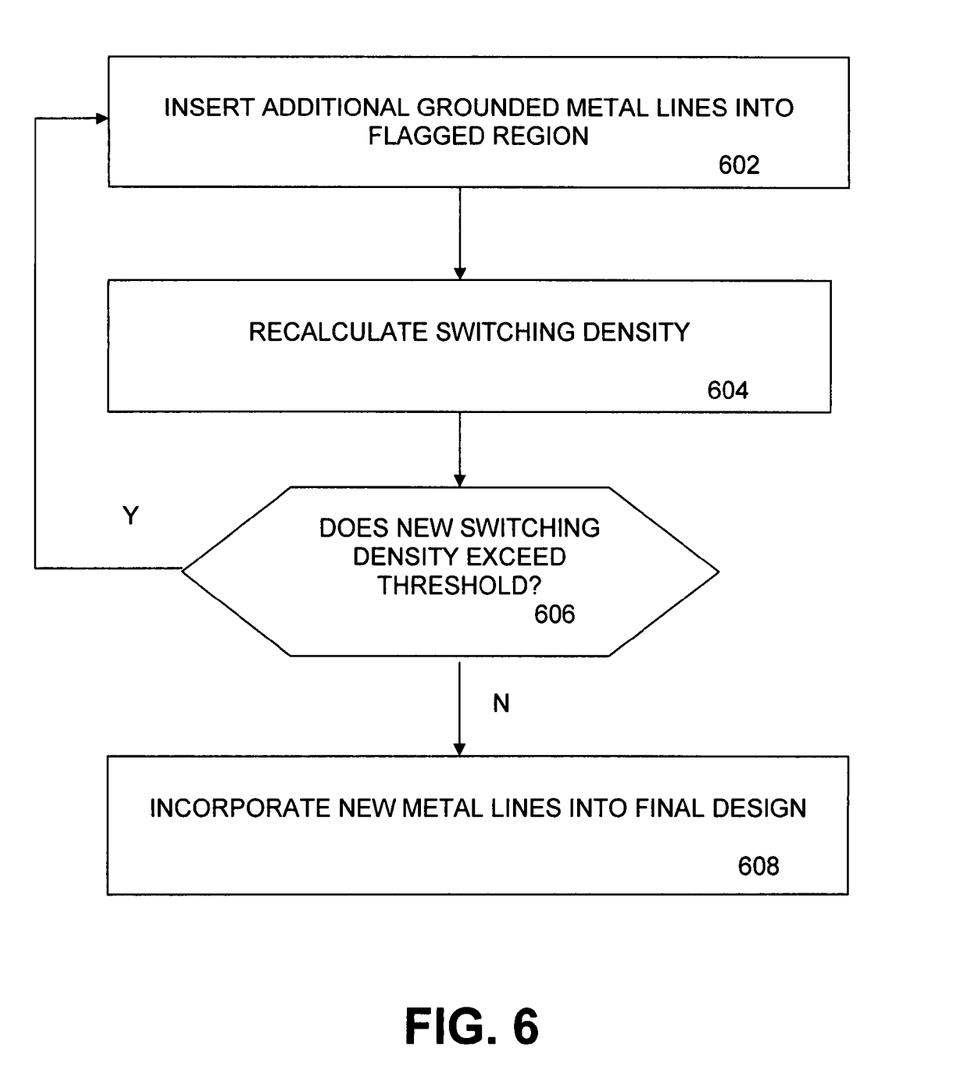
FIG. 6 is a flowchart that illustrates a method of correcting an excessive switching density condition, under an embodiment.

FIG. 6 is a flowchart that illustrates a method of correcting an excessive switching density condition, under an embodiment. The corrective step essentially comprises measures that mitigate the possibility of inductive coupling in any region (merged or non-merged) that has an excessive density. The assumption is that any region with such an excessive density will feature an enhanced possibility of inductive coupling based on the analysis performed on the test case generated in block 102. For the embodiment illustrated in FIG. 6, the corrective comprises inserting additional metal lines into each flagged region, block 602. The metal lines are grounded, thus having the effect of shielding the signal wires by reducing the net switching density. Alternatively, the inserted wires can be connected to power, however, grounding is generally preferred. The switching density is then recalculated to ensure that the corrective step has been sufficient, block 604. If the recalculated switching density is lower than the switching density threshold, as determined in block 606, then the inserted wires are added to the design, block 608. If the recalculated switching density still exceeds the threshold, as determined in block 606, further additional wires are inserted into the region until the switching density for the region is below the threshold.

In one embodiment, the inductance mitigation process can be incorporated as a design tool or component within an EDA process. Within the manufacturing process, it may be executed prior to tape out as part of the final circuit design validation and correction process.

In one embodiment, the circuit designed using the inductance mitigation process can be any type of VLSI or ULSI chip, or any type of Application Specific Integrated Circuit (ASIC) that is used in or as part of a processor, co-processor, arithmetic logic units, or other processing units. Such a processing unit can be a Graphics Processing Unit (GPU), or Visual Processing Unit (VPU), which is a dedicated graphics rendering device for a personal computer, workstation, or game console.

Aspects of the inductance mitigation process described herein may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: microcontrollers with memory (such as EEPROM), embedded microprocessors, firmware, software, etc. Furthermore, aspects of the inductance mitigation process may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the inductance mitigation process is not intended to be exhaustive or to limit the embodiments to the precise form or instructions disclosed. While specific embodiments of, and examples for, processes in graphic processing units or ASICs are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the inductance mitigation system in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate the various aspects of the methodology in any number of claim forms. For example, while only one aspect may be recited as embodied in machine-readable medium, other aspects may likewise be embodied in machine-readable medium. Accordingly, the inventors reserve the right to add additional claims after filing the application to pursue such additional claim forms for other aspects.

What is claimed is:

1. A method of analyzing and correcting induced inductance effects in a circuit design, comprising:
   generating a test design containing a plurality of parallel wires conforming to a design technology utilized by the circuit design;
   determining a minimum number of wires of the plurality of parallel wires that are required to switch at substantially the same time to cause a glitch in a target wire of the plurality of parallel wires, the minimum number of wires denoting a switching density threshold;
   determining a timing window for each component of the circuit design;
   mapping the timing window to one or more portions of a clock period;
   incorporating the clock period portions for each timing window into a design database element for each component;
   analyzing the design database elements for each component to ensure satisfaction of density design rules for the circuit design;
   determining a switching density by comparing a number of switching elements to nonswitching elements;
   comparing the switching density to the switching density threshold; and
   inserting additional grounded metal wires into the circuit design until the switching density is less than the switching density threshold.

2. The method of claim 1, further comprising:
   defining one or more regions of the circuit within the circuit design;
   for each region, comparing a number of switching elements to nonswitching elements to derive a switching density for a corresponding region; and
   comparing the switching density for each region to the switching density threshold.

3. The method of claim 2, further comprising:
   flagging any region in which the switching density exceeds the switching density threshold to generate one or more flagged regions; and
   merging flagged regions into larger regions when the switching density of the merged region exceeds the switching density threshold.

4. The method of claim 3, further comprising inserting additional grounded metal wires into any flagged region or merged region until the switching density is less than the switching density threshold.

5. The method of claim 1, wherein the timing windows are derived using static timing analysis on the circuit design.

6. The method of claim 1, wherein the design database element for each component comprises a polygon data utilized by a design database program, and further wherein the circuit design includes a plurality of metal layers.

7. The method of claim 1, wherein each component of the circuit design is assigned to a single metal layer of the plurality of layers, and the timing window for each component is associated with the corresponding single metal layer.

8. The method of claim 6, wherein the design database program comprises a graphic data system based program.

9. A non-transitory machine-readable medium having a plurality of instructions stored thereon that, when executed by a processor in a system, perform the operations of:
   generating a test design containing a plurality of parallel wires conforming to a design technology utilized by a circuit design;
   determining a minimum number of wires of the plurality of parallel wires that are required to switch at substantially the same time to cause a glitch in a target wire of the plurality of parallel wires, the minimum number of wires denoting a switching density threshold;
   determining a timing window for each component of the circuit design;
   mapping the timing window to one or more portions of a clock period;
   incorporating the clock period portions for each timing window into a design database element for each component;
   analyzing the design database elements for each component to ensure satisfaction of density design rules for the circuit design;
   determining a switching density by comparing a number of switching elements to nonswitching elements;
   comparing the switching density to the switching density threshold; and
   further comprising instructions that at least aid a user to perform the operation of inserting additional grounded metal wires into the circuit design until the switching density is less than the switching density threshold.

10. The non-transitory machine-readable medium of claim 9, further comprising instructions that perform the operations of:
    defining one or more regions of the circuit within the circuit design;

for each region, comparing a number of switching elements to nonswitching elements to derive a switching density for a corresponding region; and comparing the switching density for each region to the switching density threshold.

11. The non-transitory machine-readable medium of claim 10, further comprising instructions that perform the operations of:

flagging any region in which the switching density exceeds the switching density threshold to generate one or more flagged regions; and merging flagged regions into larger regions when the switching density of the merged region exceeds the switching density threshold.

12. The non-transitory machine-readable medium of claim 11, further comprising instructions that at least aid a user to perform the operation of inserting additional grounded metal wires into any flagged region or merged region until the switching density is less than the switching density threshold.

* * * * *